(12) United States Patent
Lee

(10) Patent No.: US 10,521,341 B2
(45) Date of Patent: Dec. 31, 2019

(54) MEMORY SYSTEM AND OPERATING METHOD TO PERFORM READ RECLAIM OPERATION BASED ON READ COUNT

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/038,635

(22) Filed: Jul. 18, 2018

(65) Prior Publication Data
US 2019/0220397 A1 Jul. 18, 2019

(30) Foreign Application Priority Data
Jan. 18, 2018 (KR) .................. 10-2018-0006385

(51) Int. Cl.
| G06F 12/02 | (2006.01) |
| G11C 16/26 | (2006.01) |
| G11C 11/56 | (2006.01) |
| G11C 16/34 | (2006.01) |
| G11C 29/52 | (2006.01) |
| G11C 16/04 | (2006.01) |

(52) U.S. Cl.
CPC ...... *G06F 12/0253* (2013.01); *G11C 11/5642* (2013.01); *G11C 16/0483* (2013.01); *G11C 16/26* (2013.01); *G11C 16/349* (2013.01); *G11C 29/52* (2013.01); *G06F 2212/702* (2013.01); *G06F 2212/7205* (2013.01); *G11C 2211/5644* (2013.01)

(58) Field of Classification Search
CPC ......... G06F 12/0253; G06F 2212/7205; G06F 2212/702; G11C 16/26; G11C 16/349; G11C 16/0483; G11C 29/52; G11C 11/5642; G11C 2211/5644
See application file for complete search history.

(56) References Cited

U.S. PATENT DOCUMENTS

| 2017/0177425 A1* | 6/2017 | Jei .................. G06F 11/076 |
| 2018/0059948 A1* | 3/2018 | Lee .................. G06F 3/064 |

FOREIGN PATENT DOCUMENTS

| KR | 1020130013574 | 2/2013 |
| KR | 1020150140496 | 12/2015 |
| KR | 1020150142792 | 12/2015 |
| KR | 1020160091499 | 8/2016 |

* cited by examiner

*Primary Examiner* — Son T Dinh
*Assistant Examiner* — Sultana Begum
(74) *Attorney, Agent, or Firm* — IP & T Group LLP

(57) ABSTRACT

A memory system includes a memory device including a plurality of memory blocks, and a controller suitable for measuring read counts of the memory blocks, calculating a global read count based on the measured read counts, and controlling the memory device to perform a read reclaim operation on a victim block when the global read count is equal to or higher than a threshold value.

20 Claims, 10 Drawing Sheets

MEMORY SYSTEM AND OPERATING METHOD TO PERFORM READ RECLAIM OPERATION BASED ON READ COUNT

CROSS-REFERENCE TO RELATED APPLICATIONS

The present application claims priority under 35 U.S.C. § 119(a) to Korean Patent Application No. 10-2018-0006385, filed on Jan. 18, 2018, the disclosure of which is incorporated herein by reference in its entirety.

BACKGROUND

1. Field

Various exemplary embodiments of the present invention relate to a memory system and, more particularly, to a memory system capable of controlling a read reclaim operation, and an operating method thereof.

2. Description of the Related Art

The computer environment paradigm has changed to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems may provide excellent stability, durability, high information access speed, and low power consumption since they have no moving parts (e.g., a mechanical arm with a read/write head) as compared with a hard disk device. Examples of memory systems having such advantages include universal serial bus (USB) memory devices, memory cards having various interfaces, and solid-state drives (SSD).

SUMMARY

Various embodiments of the present invention are directed to a memory system capable of performing a read reclaim operation. The read reclaim operation may be based on a read count of a memory block. Various embodiments of the present invention are also directed to an operating method of the memory system.

In accordance with an embodiment of the present invention, a memory system includes: a memory device including a plurality of memory blocks; and a controller suitable for measuring read counts of the memory blocks, calculating a global read count based on the measured read counts, and controlling the memory device to perform a read reclaim operation on a victim block when the global read count is equal to or higher than a threshold value.

In accordance with an embodiment of the present invention, an operating method of a memory system includes: measuring read counts of a plurality of memory blocks; calculating a global read count based on the measured read counts; and performing a read reclaim operation on a victim block when the global read count is equal to or higher than a threshold value.

In accordance with an embodiment of the present invention, a memory system includes: a memory device including a plurality of memory blocks; and a controller suitable for: measuring a read count of each memory block at a timing determined based on a relationship between a host read amount and a fixed host read amount, calculating a global read count based on the read count of each memory block; determining which block is a victim block based on the read count; and performing a read reclaim operation on the victim block when the global read count is equal to or higher than a threshold value.

DETAILED DESCRIPTION

Figure 1:
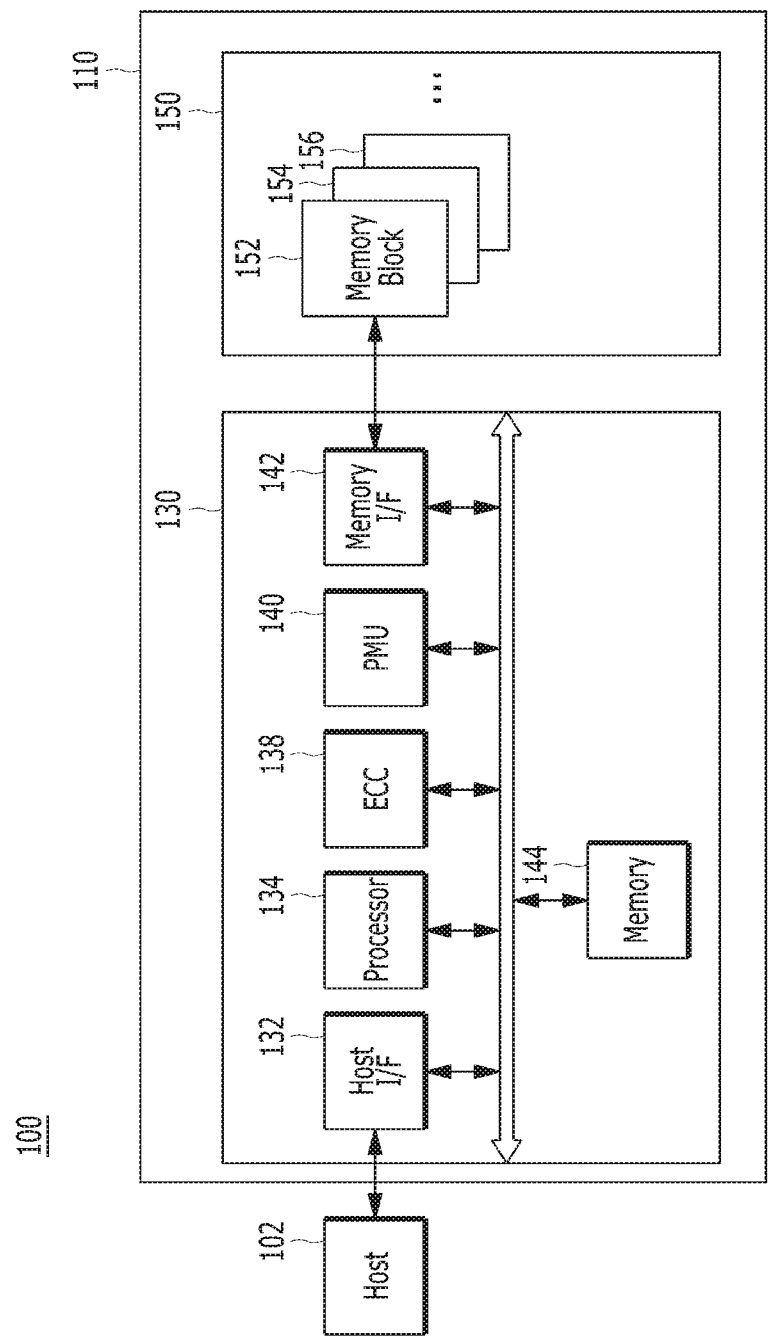
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated for clearly illustrating certain features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110, in accordance with an embodiment of the present invention.

Referring to FIG. 1, the data processing system 100 may include a host 102 operatively coupled to the memory system 110.

The host 102 may include portable electronic devices such as a mobile phone, a MP3 player and a laptop computer or non-portable electronic devices such as a desktop computer, a game machine, a TV and a projector.

The host 102 may include at least one OS (operating system). The OS may manage and control overall functions and operations of the host 102. The OS may support provide an operation between the host 102 and a user, which may be achieved or implemented with the data processing system 100 or the memory system 110. The OS may support functions and operations requested by a user. By way of example but not limitation, the OS may be divided into a general OS and a mobile OS, depending on whether it is customized for the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a customized function of providing a mobile service to users and a power saving function of a system may include Android, iOS and Windows Mobile. The host 102 may include a plurality of OSs. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request.

The memory system 110 may store data for the host 102 in response to a request of the host 102. Non-limited examples of the memory system 110 may include a solid-state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card and a memory stick. The MMC may include an embedded MMC (eMMC), a reduced size MMC (RS-MMC) and micro-MMC. The SD card may include a mini-SD card and micro-SD card.

The memory system 110 may include various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as described above. By the way of example but not limitation, the controller 130 and the memory device 150 may be integrated as a single semiconductor device to constitute an SSD. When the memory system 110 is used as an SSD, the operating speed of the host 102 connected to the memory system 110 can be improved. In another example, the controller 130 and the memory device 150 may be integrated as a single semiconductor device to constitute a memory card. For example, the controller 130 and the memory device 150 may constitute a memory card such as a PCMCIA (personal computer memory card international association) card, a CF card, an SMC (smart media card), memory stick, an MMC including an RS-MMC and a micro-MMC, a SD card including a mini-SD, a micro-SD and an SDHC, or an UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device which may retain stored data even though power is not supplied. The memory device 150 may store data provided from the host 102 through a write operation, while outputting data stored therein to the host 102 through a read operation. In an embodiment, the memory device 150 may include a plurality of memory dies (not shown). Each memory may include a plurality of planes (not shown). Each plane may include a plurality of memory blocks 152 to 156. Each of the memory blocks 152 to 156 may include a plurality of pages. Each of the pages may include a plurality of memory cells coupled to a word line. In an embodiment, the memory device 150 may be a flash memory having a 3-dimensional (3D) stack structure.

The controller 130 may control the memory device 150 in response to a request from the host 102. For example, the controller 130 may provide data read from the memory device 150 to the host 102. The controller 130 may store data provided from the host 102 into the memory device 150. For this operation, the controller 130 may control read, write, program and erase operations of the memory device 150.

More specifically, the controller 130 may include a host interface (I/F) unit 132, a processor 134, an error correction code (ECC) unit 138, a Power Management Unit (PMU) 140, a memory interface unit 142, and a memory 144, each engaged with each other via an internal bus.

The host interface unit 132 may process a command and data of the host 102. The host interface unit 132 may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface unit 132 may be driven via a firmware, that is, a host interface layer (HIL) for exchanging data with the host 102.

Further, the ECC unit 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success or fail signal. When the number of error bits is more than a threshold value of correctable error bits, the ECC unit 138 may not correct the error bits. The ECC unit 138 may output the error correction fail signal.

The ECC unit 138 may perform error correction through a coded modulation such as a Low-Density Parity Check (LDPC) code, a Bose-Chaudhri-Hocquenghem (BCH) code, a turbo code, a Reed-Solomon code, a convolution code, a Recursive Systematic Code (RSC), a Trellis-Coded Modulation (TCM) and a Block coded modulation (BCM). However, the ECC unit 138 is not limited thereto. The ECC unit 138 may include other relevant circuits, modules, systems or devices for use in error correction.

The PMU 140 may manage an electrical power used and provided in the controller 130.

The memory interface unit 142 may work as a memory/storage interface for providing an interface between the controller 130 and the memory device 150 such that the controller 130 may control the memory device 150 in response to a request from the host 102. When the memory device 150 is a flash memory or specifically a NAND flash memory, the memory interface unit 142 may be NAND flash controller (NFC) and may generate a control signal for the memory device 150. The memory interface unit 142 may provide data for the memory device 150 under the control of the processor 134. The memory interface unit 142 may work as an interface (e.g., a NAND flash interface) for handling a command and data between the controller 130 and the memory device 150. Specifically, the memory interface unit 142 may support data transmission between the controller 130 and the memory device 150. The memory interface unit 142 may use a firmware, that is, a flash interface layer (FIL) for exchanging data with the memory device 150.

The memory 144 may serve as a working memory of the memory system 110 and the controller 130. The memory 144 may store data for driving the memory system 110 and the controller 130. The controller 130 may control the memory device 150 to perform read, program, and erase operations in response to a request entered from the host 102. The controller 130 may provide data read from the memory device 150 to the host 102. Or, the controller 130 may store data provided from the host 102 into the memory device 150. The memory 144 may store data required for the controller 130 and the memory device 150 to perform these operations.

The memory 144 may be a volatile memory. By the way of example but not limitation, the memory 144 may be a static random-access memory (SRAM) or dynamic random-access memory (DRAM). The memory 144 may be disposed within or out of the controller 130. FIG. 1 exemplifies the memory 144 disposed within the controller 130. In an embodiment, the memory 144 may be an external volatile memory having a memory interface transferring data between the memory 144 and the controller 130.

As described above, the memory 144 may include at least one of a program memory, a data memory, a write buffer/cache, a read buffer/cache, a data buffer/cache and a map buffer/cache to store some data required to perform data write and read operations between the host 102 and the memory device 150 and other data required for the controller 130 and the memory device 150 to perform these operations.

The processor 134 may control overall operations of the memory system 110. The processor 134 may use a firmware to control the overall operations of the memory system 110. The firmware may be referred to as flash translation layer (FTL).

For example, the controller 130 may perform an operation requested by the host 102 in the memory device 150 through the processor 134, which is implemented with a microprocessor, a CPU, or the like. In other words, the controller 130 may perform a command operation corresponding to a command entered from the host 102. Herein, the controller 130 may perform a foreground operation as the command operation corresponding to the command entered from the host 102. For example, the foreground operation may include a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is implemented with a microprocessor or a CPU. Herein, the background operation performed on the memory device 150 may include an operation of copying and processing data stored in some memory blocks among the memory blocks 152 to 156 of the memory device 150 into other memory blocks, e.g., a garbage collection (GC) operation, an operation of performing swapping between the memory blocks 152 to 156 of the memory device 150 or between the data of the memory blocks 152 to 156, e.g., a wear-leveling (WL) operation, an operation of storing the map data stored in the controller 130 in the memory blocks 152 to 156 of the memory device 150, e.g., a map flush operation, or an operation of managing bad blocks of the memory device 150, e.g., a bad block management operation of detecting and processing bad blocks among the memory blocks 152 to 156 included in the memory device 150.

Also, in the memory system 110 in accordance with the embodiment of the invention, the controller 130 may perform a plurality of command executions corresponding to a plurality of commands entered from the host 102. For example, the controller 130 may perform a plurality of program operations corresponding to a plurality of write commands, a plurality of read operations corresponding to a plurality of read commands, and a plurality of erase operations corresponding to a plurality of erase commands, in the memory device 150. Also, the controller 130 may update meta-data, (particularly, map data) according to the command executions.

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation performing with more reliability is needed. Hereafter, the memory device of the memory system in accordance with the embodiment of the present invention is described in detail with reference to FIGS. 2 to 3.

Figure 2:
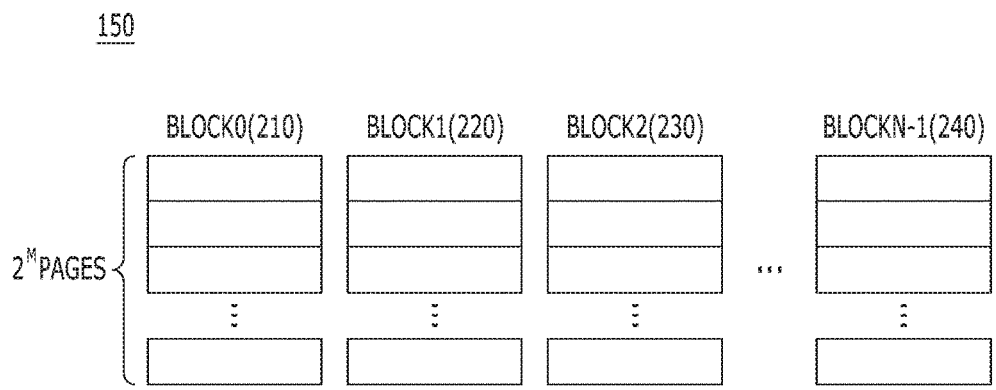
FIG. 2 is a schematic diagram illustrating an exemplary configuration of a memory device employed in the memory system shown in FIG. 1.
Figure 3:
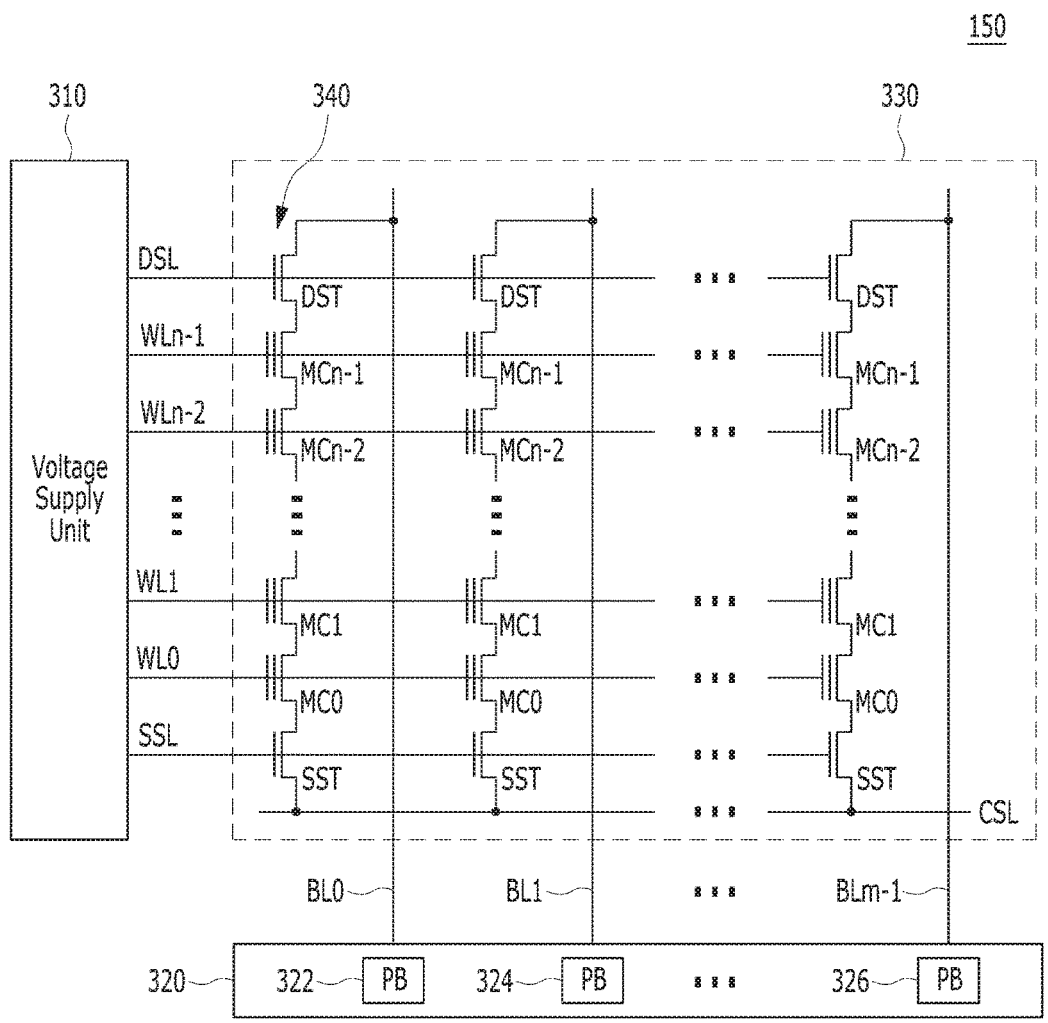
FIG. 3 is a circuit diagram illustrating an exemplary configuration of a memory cell array of a memory block in the memory device shown in FIG. 1.
Figure 4:
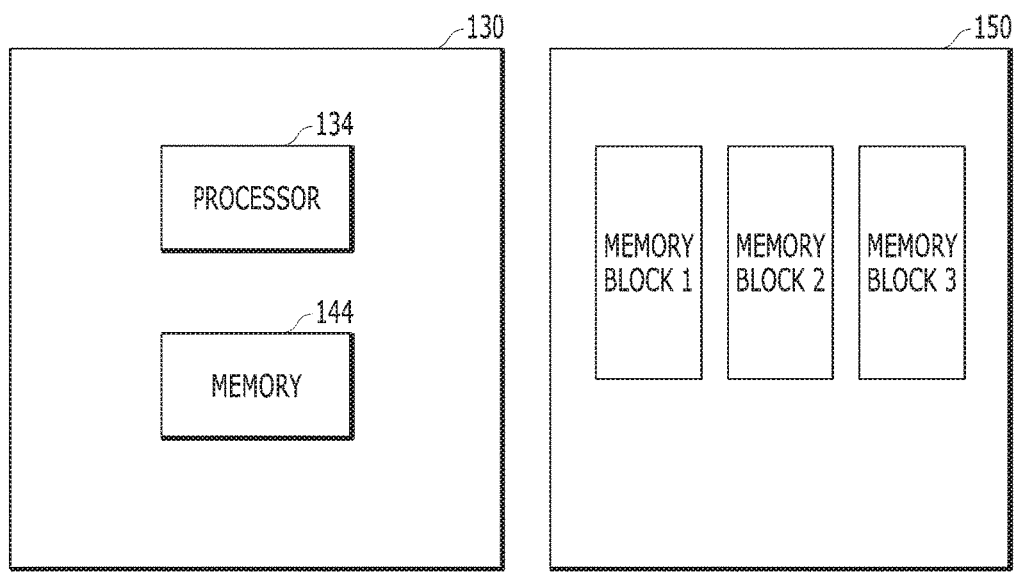
FIG. 4 is a schematic diagram illustrating a memory device and a controller included in a memory system in accordance with an embodiment of the present invention.

FIG. 2 is a schematic diagram illustrating the memory device 150. FIG. 3 is a circuit diagram illustrating an exemplary configuration of a memory cell array of a memory block 330 in the memory device 150. FIG. 4 is a schematic diagram illustrating an exemplary 3D structure of the memory device 150.

Referring to FIG. 2, the memory device 150 may include a plurality of memory blocks BLOCK0 to BLOCKN-1. Here, N is an integer larger than 1. Each of the blocks BLOCK0 to BLOCKN-1 may include a plurality of pages, for example, $2^M$ pages, the number of which may vary according to circuit design. Here, M is an integer larger than 1. Herein, although it is described that each of the memory blocks include $2^M$ pages, each of the memory blocks may include M pages as well. Each of the pages may include a plurality of memory cells that are coupled to a plurality of word lines WL.

Also, memory cells included in the respective memory blocks BLOCK0 to BLOCKN-1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells each storing one-bit data. The SLC memory blocks may generally have higher data computing performance and higher durability than the MCL memory blocks. The MLC memory blocks may include a plurality of pages which are embodied by memory cells, each storing multi-bit data (for example, 2 or more bits). The MLC memory blocks may generally have a larger data storage in a space, that is, higher integration density, than the SLC memory block. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied in memory cells each capable of storing 3-bit data. The QLC memory blocks may include a plurality of pages which are embodied in memory cells each capable of storing 4-bit data.

Although the embodiment of the invention exemplarily describes, the memory device 150 may be the nonvolatile memory for the sake of convenience in description. The memory device 150 may be implemented with any one of a phase change random access memory (PCRAM), a resistive random access memory (RRAM(ReRAM)), a ferroelectrics random access memory (FRAM), and a spin transfer torque magnetic random access memory (STT-RAM(STT-MRAM)).

The memory blocks 210, 220, 230, 240 may store the data transferred from the host 102 through a program operation. The memory blocks 210, 220, 230, 240 may transfer data stored therein to the host 102 through a read operation.

Referring to FIG. 3, the memory block 330 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST, SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0. The last cell string is coupled to the last bit line BLm-1.

Although FIG. 3 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which generates different word line voltages including a program voltage, a read voltage, and a pass voltage to supply one of them to respective word lines according to an operation mode. The voltage generation operation of the voltage supply unit 310 may be controlled by a control circuit (not illustrated). Under the control of the control circuit, the voltage supply unit 310 may select at least one of the memory blocks (or sectors) of the memory cell array, select at least one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may work as a write driver for supplying a voltage or a current into bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

A read disturbance phenomenon refers to a phenomenon in which a read operation is performed on a plurality of pages included in a specific block and a cell-level of another page included in the block increases. When the read disturbance phenomenon is accumulated, error correction capability of the ECC unit 138 may be exceeded. When a read count is equal to or higher than a threshold value, the read reclaim operation refers to an operation of storing valid pages stored in a victim block in a target block and performing an erase operation on remaining pages included in the victim block in order to avoid an unrecoverable error.

The read reclaim operation is a background operation performed in the memory device 150 under control of the controller 130 without a command entered from the host. When the background operation is performed over a predetermined time, overhead may occur in a foreground operation performed based on the command of the host. Thus, the controller 130 does not perform the read reclaim operation on a large number of victim blocks at a time. Generally, the controller 130 may perform the read reclaim operation on a predetermined number of memory blocks for a predetermined time interval. The predetermined time interval where the read reclaim operation is performed may be determined according to the damage extent of the memory blocks (e.g., a risk or a possibility of data loss at a specific memory block). The read reclaim operation may be performed on victim blocks which are accumulated at the predetermined time interval. Consequently, occurrence of an unrecoverable error may be avoided.

In a conventional memory system, when capacities of data, which are read according to a read command entered from the host, are equal to or greater than a predetermined threshold value, the read reclaim operation is performed on a detected read reclaim target block, that is, a victim block.

If the read reclaim operation is performed based on the capacities of the data, which are read according to the read command of the host, the read reclaim operation reflecting a damage extent of a memory block may not be performed.

If a read operation is frequently performed on data of a specific memory block, a read count of the memory block increases and a frequency of the read disturbance phenomenon also increases, resulting in occurrence of an unrecoverable error. Therefore, a memory block whose read count is equal to or higher than a threshold value may have a higher probability of the occurrence of an unrecoverable error, that is, a higher extent of damage than other memory blocks having read counts lesser than the threshold value. The extent of damage of the memory block may be proportional to the read count of the memory block. Even though the capacities of the data read in response to the read commands entered from the host are substantially same, the read count of each memory block may be different depending on the methods of measuring the read count or the types of the command. That is, even though the capacities of the data are equal to each other, the extent of damage of a memory block may vary depending on the methods of determining or the read count and/or the types of the command.

For example, the extent of damage of the memory block may depend on the type of the command of the host and/or the types of handling the command of the host. For example, even though the capacities of the data, which are read according to the command, are equal to each other, the read count measured in a case when data in a single memory block are sequentially accessed and outputted may be higher than the read count measured when data in several blocks are randomly or arbitrarily accessed and outputted. Therefore, if a determination of whether or not to perform the read reclaim operation is made on a basis of only the capacities of the data read according to the command when the sequential read operation is performed, the read reclaim operation may be performed too frequently for the extent to which the memory block is actually damaged.

In addition, when the random read operation is performed, the memory block may be rapidly damaged and the unrecoverable error may occur before the capacities of the data which are read according to the command of the host reach the threshold value, that is, before the read reclaim operation is performed on the victim block.

The extent of damage of the memory block depends on the methods of determining and measuring the read count. The read count measured in units of individual memory blocks may be different from the read count measured in units of super blocks although the capacities of the data read according to the command of the host are equal to each other. That is, even though the capacities of the data are equal to each other, the extent of the damage of the memory block may be determined differently depending on the methods of determining and measuring the read count. Accordingly, in existing conventional memory systems, there is a problem in that it is difficult to correctly determine the extent to which the memory block is actually damaged only based on the capacities of the data read according to the command of the host.

According to an embodiment of the present invention, are read reclaim operation may be performed based on an actual read count of a memory block rather than the capacities of data read according to the command of the host. Thus according to an embodiment of the present invention, a read reclaim operation to a memory block may be performed taking into consideration the extent of the damage of the memory block.

FIG. 4 is a schematic diagram illustrating a memory device 150 and a controller 130 included in a memory system 110 in accordance with an embodiment of the present invention.

FIG. 4 illustrates a simplified exemplary configuration, which is related to the present invention, of the memory system 110 shown in FIG. 1.

As shown in FIG. 1, the processor 134 may control overall operations of the memory system 110. For example, the processor 134 may control a program operation and a read operation performed in a background operation for the memory device 150. The processor 134 may measure a read count of a memory block.

The memory 144 may store the read count, measured by the processor 134, and data read in response to a command entered from the host 102.

When a read command is entered from the host 102, the processor 134 may read data corresponding to the read command at a memory block included in the memory device 150. When a logical address of data to be read is entered from the host 102 with the command, the processor 134 may read the data from a memory block having a physical address, recognized through a mapping operation, corresponding to the logical address.

The processor 134 may temporarily store the data, read from the memory block in response to the command entered from the host 102, in the memory 144 and measure a capacity of the stored data. The processor 134 may also separately store the measured capacity of the stored data in the memory 144.

Whenever the processor 134 reads data from a memory block, the processor 134 may increase a read count of the memory block and may store the read count of the memory block in the memory 144. Further, the processor 134 may store the read count of the memory block in another memory block, which is separate and independent from the memory block, to prepare for an abnormal situation such as when a sudden power-off (SPO) occurs.

Whenever the capacity of the data stored in the memory 144 (hereinafter referred to as a "host read amount TAHR") becomes an integral multiple of a capacity of data having a specific constant value (hereinafter referred to as a "fixed host read amount FAHR"), the processor 134 may measure the read count stored in the memory 144, detect a victim block, and measure a global read count. The fixed host read amount FAHR, as described below, may vary according to how much the read count of the memory block increases. The victim block is a block having a read count equal to or higher than a threshold value. The global read count may be a total sum of the read counts of all the memory blocks or of a group of memory blocks.

When the host read amount TAHR is not the integral multiple of the fixed host read amount FAHR, the processor 134 may read data from the memory block in response to the command entered from the host. Continuously, the processor 134 may perform an operation of increasing the read count of the memory block, until the host read amount TAHR becomes an integral multiple of the fixed host read amount FAHR.

Whenever the host read amount TAHR becomes an integral multiple of the fixed host read amount FAHR, the processor 134 may calculate a global read count increase rate GRCI by calculating an average increase rate of the global read count. The processor 134 may decrease the fixed host read amount FAHR when the global read count increase rate GRCI is higher than a reference increase rate SRCI. The processor 134 may increase the fixed host read amount FAHR when the global read count increase rate GRCI is lower than the reference increase rate SRCI.

The reference increase rate SRCI may be a threshold value of the global read count increase rate GRCI. Whenever the host read amount TAHR becomes an integral multiple of a first fixed host read amount $FAHR_1$, the processor 134 may measure the global read count and calculate a first global read count increase rate $GRCI_1$ by calculating the average increase rate of the global read count.

When the first global read count increase rate $GRCI_1$ is higher than a first reference increase rate $SRCI_1$, the processor 134 may calculate a second fixed host read amount $FAHR_2$ having a smaller value than the first fixed host read amount $FAHR_1$. The first reference increase rate $SRCI_1$ and the first fixed host read amount $FAHR_1$ may be initial values. The processor 134 may calculate the second fixed host read amount $FAHR_2$ from the first fixed host read amount $FAHR_1$ by calculating a ratio of the first global read count increase rate $GRCI_1$ to the first reference increase rate $SRCI_1$.

The processor 134 may select the first global read count increase rate $GRCI_1$ as a threshold value, i.e., a second reference increase rate $SRCI_2$. The processor 134 may compare a size of a second global read count increase rate $GRCI_2$ with a size of the second reference increase rate $SRCI_2$, thereby calculating a subsequent fixed host read amount $FAHR_3$.

The processor 134 may change a size of the fixed host read amount FAHR. Subsequently, the processor 134 may compare the global read count stored in the memory 144 with a size of the threshold value. The processor 134 may perform the read reclaim operation on the detected victim block when the global read count is higher than the threshold value.

Figure 5:
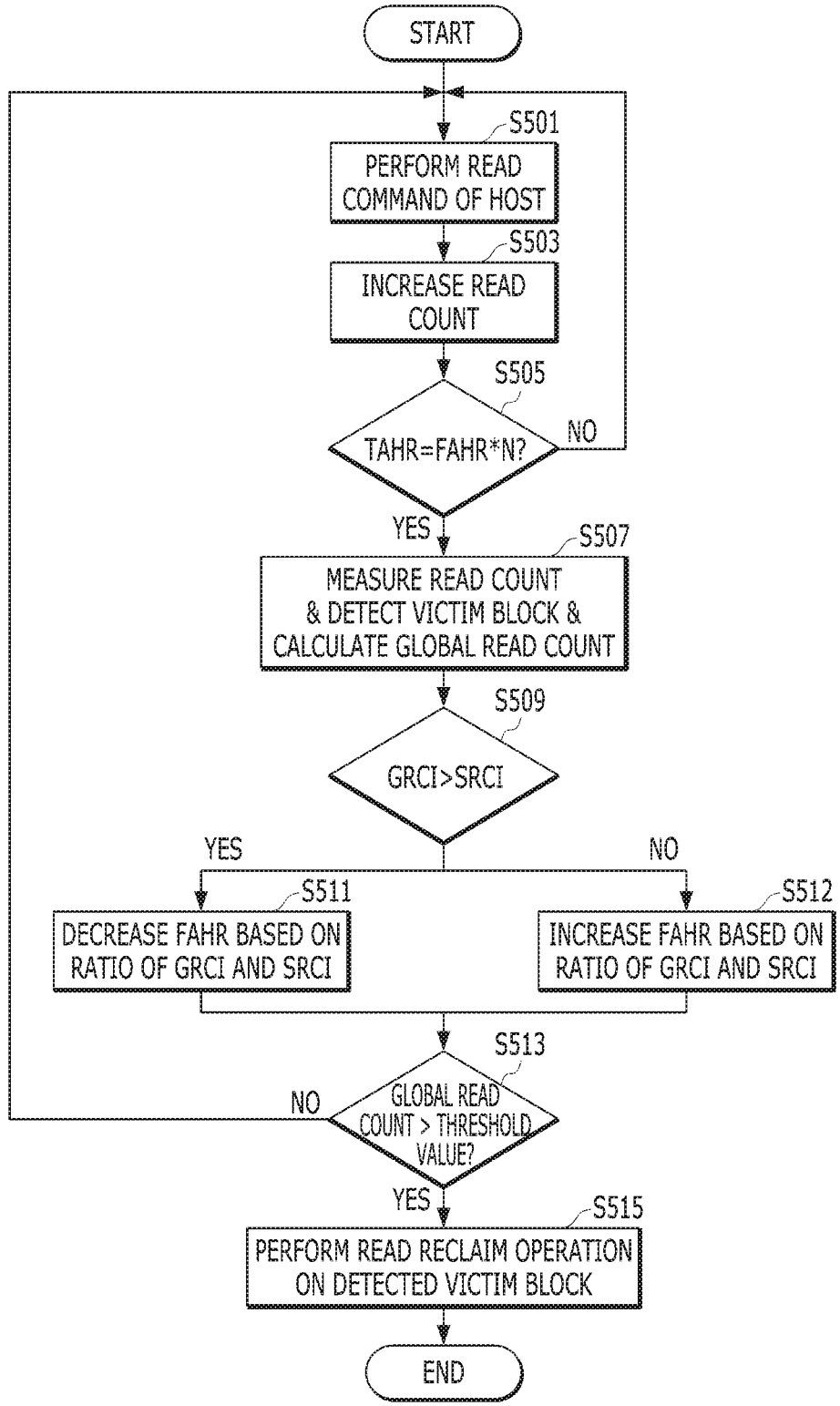
FIG. 5 is a flowchart illustrating a read reclaim operation, in accordance with an embodiment of the present invention.

FIG. 5 is a flowchart illustrating an exemplary read reclaim operation in accordance with an embodiment of the invention. The controller 130 may control the memory device 150 to perform the read reclaim operation.

Referring to FIG. 5, in step S501, the processor 134 may read data from a memory block in response to a command entered from a host. The processor 134 may store in the memory 144 address information of pages in which data to be read based on a read command of the host is stored and a block including the pages.

In step S503, the processor 134 may increase a read count of the memory block when reading the data from the memory block. Whenever the processor 134 reads the data from the memory block, the processor 134 may increase the read count of the memory block. The processor 134 may store the read count of the memory block in the memory 144. Further, the processor 134 may store the read count of the memory block in another memory block, which is separate and independent from the memory block, to prepare for an abnormal situation such as when a sudden power-off occurs. The manner for managing the read count of the memory block may vary. The read count may be measured and increased in units of individual blocks or super blocks each comprising a plurality of blocks.

In step S505, the processor 134 may determine a timing of measuring the increased read count according to the following Equation. Since a memory space may be insufficient to measure the read count whenever the read count of the memory block increases, the increased read count may be measured and stored only when a predetermined condition is satisfied.

$$TAHR = FAHR * N \qquad \text{[Equation]}$$

In Equation, "TAHR" represents a host read amount, "FAHR" represent a fixed host read amount, and "N" represent a natural number.

The host read amount TAHR is a capacity of the data read based on the command of the host, and the fixed host read amount FAHR is a capacity of the data having a specific constant value. Whenever the host read amount TAHR becomes an integral multiple of the fixed host read amount FAHR, the processor 134 may measure the read count stored in the memory 144, detect a victim block and measure a global read count.

As a result of the determination made in step S505, when the host read amount TAHR is not the integral multiple of the fixed host read amount FAHR (that is, "NO" in step S505), the processor 134 may read the data from the memory block based on the command of the host and continuously perform an operation of increasing the read count of the memory block until the host read amount TAHR becomes equal to the integral multiple of the fixed host read amount FAHR.

As a result of the determination made in step S505, when the host read amount TAHR is the integral multiple of the fixed host read amount FAHR (that is, "YES" in step S505), the processor 134 may measure the read count stored in the memory 144, detect a victim block and calculate a global read count in step S507.

The processor 134 may detect a read reclaim target block, i.e., the victim block, among the memory blocks based on the measured read count. The processor 134 may detect a block whose read count is equal to or higher than a read reclaim reference value as the victim block. A read reclaim reference read count may be obtained experimentally as a read count with a high possibility that an unrecoverable error occurs in the memory block. The processor 134 may store address information of the detected victim block in the memory 144 and separately store the address information in a memory block in case a sudden power-off (SPO) occurs.

The processor 134 may add the read counts of all the memory blocks to calculate the global read count. Even though the host read amounts TAHR are the same depending on the methods of measuring the read counts, an absolute value of the global read count may be different. However, the greater the global read count calculated depending on the methods of measuring the read counts, the more frequently the data of the memory block is read, and the greater the extent of damage of the memory block may be.

In step S509, the processor 134 may compare a size of a global read count increase rate GRCI with a size of a reference increase rate SRCI.

In step S509, the processor 134 may calculate the global read count increase rate GRCI by calculating an average increase rate of the global read count whenever the host read amount TAHR becomes equal to the integral multiple of the fixed host read amount FAHR in step S507.

The reference increase rate SRCI may be a threshold value of the global read count increase rate GRCI. Whenever the host read amount TAHR becomes equal to the integral multiple of a first fixed host read amount $FAHR_1$, the processor 134 may measure the global read count and calculate a first global read count increase rate $GRCI_1$ by calculating the average increase rate of the global read count.

When the first global read count increase rate $GRCI_1$ is higher than a first reference increase rate $SRCI_1$ (that is, "YES" in step S509), the processor 134 may calculate a second fixed host read amount $FAHR_2$ having a smaller value than the first fixed host read amount $FAHR_1$ in step S511. The first reference increase rate $SRCI_1$ and the first fixed host read amount $FAHR_1$ may be initial values. The processor 134 may calculate the second fixed host read amount $FAHR_2$ from the first fixed host read amount $FAHR_1$ by calculating a ratio of the first global read count increase rate $GRCI_1$ to the first reference increase rate $SRCI_1$.

Whenever the host read amount TAHR becomes equal to the integral multiple of the second fixed host read amount $FAHR_2$ in a similar manner, the processor 134 may measure the global read count and calculate a second global read count increase rate $GRCI_2$ by calculating the average increase rate of the global read count.

The processor 134 may select the first global read count increase rate $GRCI_1$ as a threshold value, i.e., a second reference increase rate $SRCI_2$. The processor 134 may compare a size of the second global read count increase rate $GRCI_2$ with a size of the second reference increase rate $SRCI_2$, thereby calculating a subsequent fixed host read amount $FAHR_3$.

When the first global read count increase rate $GRCI_1$ is lower than the first reference increase rate $SRCI_1$ (that is, "NO" in step S509), the processor 134 may calculate the second fixed host read amount $FAHR_2$ having a greater value than the first fixed host read amount $FAHR_1$ in step S512. The processor 134 may calculate the second fixed host read amount $FAHR_2$ from the first fixed host read amount $FAHR_1$ by calculating a ratio of the first global read count increase rate $GRCI_1$ to the first reference increase rate $SRCI_1$.

According to an embodiment of the invention, when the global read count increase rate GRCI is higher than the reference increase rate SRCI, the processor 134 may determine that the extent of damage of the memory block drastically deteriorates, and thus may decrease the fixed host read amount FAHR, thereby determining whether or not the read reclaim operation is performed more frequently.

When the global read count does not exceed the threshold value in a state where the fixed host read amount FAHR is decreased in step S511, the step S501 may be carried out again, and a frequency that a total sum of the host read amount TAHR reaches an integral multiple of the fixed host read amount FAHR may increase in step S505. Therefore, the global read count may be measured more frequently in step S507. Consequently, the size of the global read count may be more frequently compared with the size of the threshold value in step S513.

After the size of the fixed host read amount FAHR is adjusted based on the global read count increase rate in steps S511 and S512, the processor 134 may compare the size of the global read count and the size of the threshold value in step S513.

When it is determined that the global read count is smaller than the threshold value (that is, "NO" in step S513), the processor 134 does not perform the read reclaim operation on the detected victim block and returns to the step S501 to read data of a memory block based on a new read command of the host.

When it is determined that the global read count is greater than the threshold value (that is, "YES" in step S513), the read reclaim operation is performed on the detected victim block in step S515.

Figure 6:
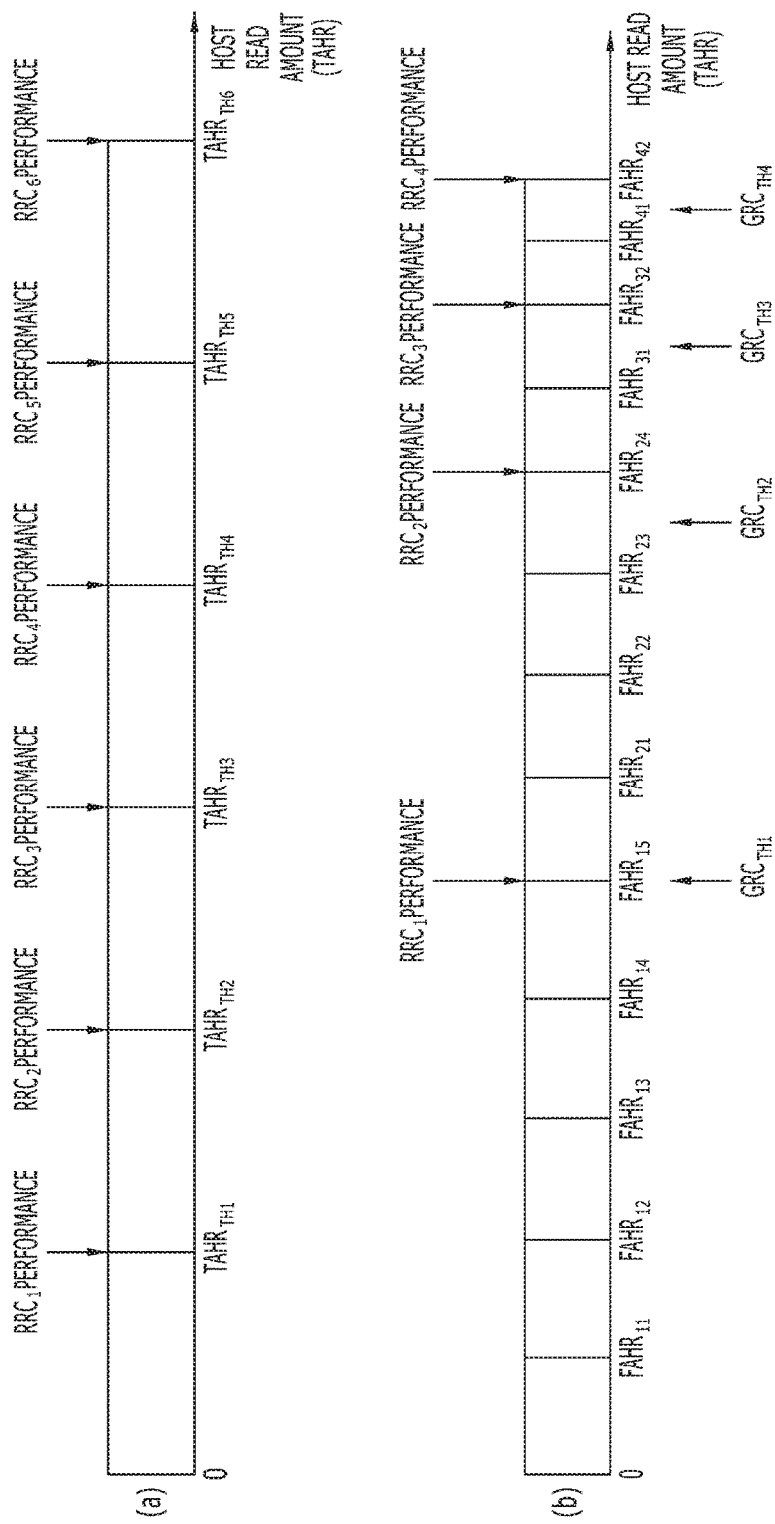
FIG. 6 is a diagram illustrating a timeline comparison between a conventional read reclaim operation and a read reclaim operation according to an embodiment of the present invention.

FIG. 6 is a diagram illustrating a timeline comparison between a conventional read reclaim operation according to a prior art and a read reclaim operation according to an embodiment of the invention.

Referring to FIG. 6(a), in a conventional memory system, the read reclaim operation is performed on victim blocks whenever the host read amount TAHR reaches a threshold value. When the host read amount TAHR reaches a first threshold value $TAHR_{TH1}$, the processor 134 performs a first read reclaim operation $RRC_1$ on the victim blocks detected until the host read amount TAHR reaches the first threshold value $TAHR_{TH1}$. When the host read amount TAHR reaches a second threshold value $TAHR_{TH2}$, the processor 134 performs a second read reclaim operation $RRC_2$ on the victim blocks detected from a time at which the host read amount TAHR reaches the first threshold value $TAHR_{TH1}$ to a time at which the host read amount TAHR reaches the second threshold value $TAHR_{TH2}$. In the conventional memory system, the read reclaim operation is performed whenever an amount of data read from the memory block reaches a specific threshold value based on a command of the host.

Referring to FIG. 6(*b*), according to an embodiment of the invention, the processor 134 may measure the global read count whenever the host read amount TAHR becomes an integer multiple of the fixed host read amount FAHR, and perform the read reclaim operation on the detected victim blocks when the measured global read count reaches the threshold value. For example, in case the first global read count is greater than a first threshold value $GRC_{TH1}$ when the host read amount TAHR becomes five times the first fixed host read amount $FAHR_1$, the processor 134 may perform the first read reclaim operation $RRC_1$ on the detected victim blocks. The processor 134 may determine a size of the second fixed host read amount $FAHR_2$ based on a ratio of the first global read count increase rate $GRCI_1$ and the first reference increase rate $SRCI_1$. The processor 134 may perform the second read reclaim operation $RRC_2$ on the detected victim blocks when the second global read count measured at a time when the host read amount TAHR becomes four times the second fixed host read amount $FAHR_2$ is greater than a second threshold value $GRC_{TH2}$. According to the embodiment of the invention, the processor 134 may not perform the read reclaim operation whenever the host read amount TAHR reaches the threshold value, but rather may perform the read reclaim operation whenever the global read count reaches the threshold value. Therefore, the read reclaim operation may be performed reflecting the extent of damage of the memory block. The processor 134 may adjust the frequency of measuring the global read count by changing the size of the fixed host read amount FAHR based on the global read count increase rate GRCI.

According to an embodiment of the invention, the processor 134 may adjust the fixed host read amount FAHR depending on an attribute of a read command of the host. Even though the amounts of host read are the same as each other, a speed at which the memory block is damaged may vary depending on an attribute of the read command. When the read command is a sequential read command, the memory block may be slowly damaged because the data is sequentially read in one block and data of another block is read. When the read command is a random read command, the memory block may be rapidly damaged because the data is arbitrarily read from a plurality of blocks.

When the read command is a sequential read command, the processor 134 may increase the fixed host read amount FAHR. When the read command is a random read command, the processor 134 may decrease the fixed host read amount FAHR.

As a result, when the read command is a random read command, it may be determined whether or not the read reclaim operation is performed more frequently so that it is possible to avoid a problem that an unrecoverable error occurs in a situation where the memory is damaged at a high speed.

Hereafter, various data processing systems and electronic devices to which the memory system 110 including the memory device 150 and the controller 130, as described above with reference to FIGS. 1 to 6, in accordance with the embodiment of the disclosure will be described in detail with reference to FIGS. 7 to 15.

Figure 7:
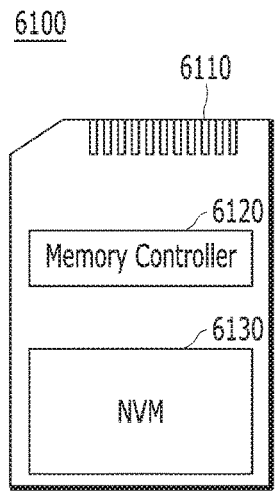
FIGS. 7 to 15 are diagrams schematically illustrating application examples of the data processing system, in accordance with various embodiments of the present invention.

FIG. 7 is a diagram schematically illustrating another example of the data processing system including the memory system in accordance with the present embodiment. FIG. 7 schematically illustrates a memory card system to which the memory system in accordance with the present embodiment is applied.

Referring to FIG. 7, the memory card system 6100 may include a memory controller 6120, a memory device 6130 and a connector 6110.

More specifically, the memory controller 6120, configured to access the memory device 6130, may be electrically connected to the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use a firmware for controlling the memory device 6130. That is, the memory controller 6120 may correspond to the controller 130 of the memory system 110 described with reference to FIG. 1, while the memory device 6130 may correspond to the memory device 150 of the memory system 110 described with reference to FIG. 1.

Thus, the memory controller 6120 may include a RAM, a processing unit, a host interface, a memory interface and an error correction unit.

The memory controller 6120 may communicate with an external device, for example, the host 102 of FIG. 1 through the connector 6110. By the way of example but not limitation, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or specific mobile electronic devices.

The memory device 6130 may be implemented by a nonvolatile memory. By the way of example but not limitation, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and a universal flash storage (UFS).

Figure 8:
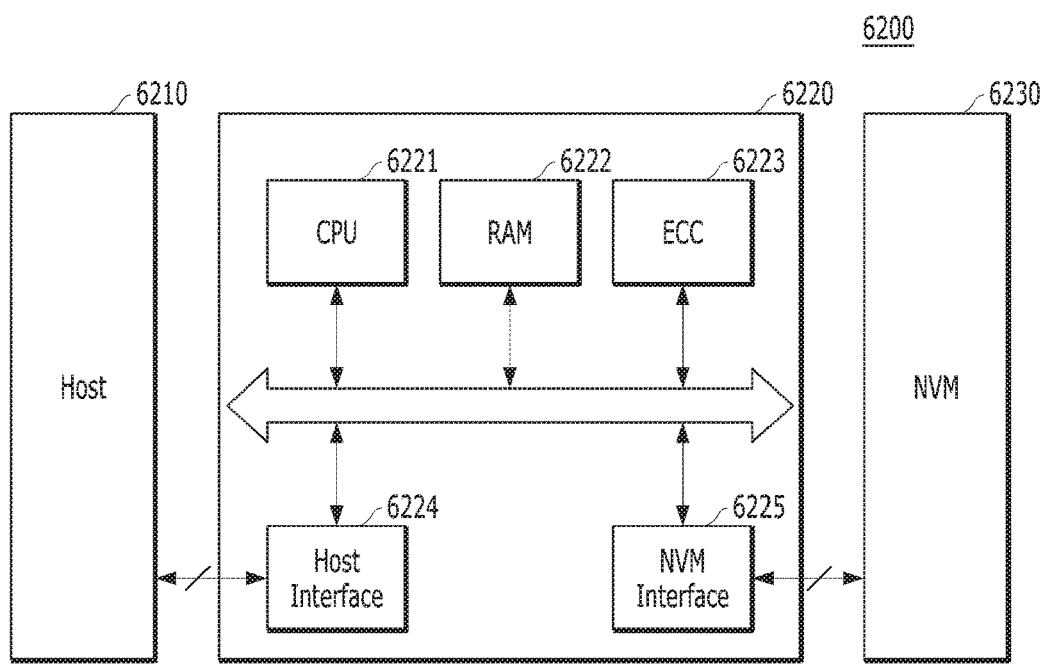

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (a CF, a SD, a micro-SD or the like) or USB device, as described with reference to FIG. 1. The memory device 6230 may correspond to the memory device 150 in the memory system 110 illustrated in FIG. 1. The memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, the BCH code, the turbo code, the Reed-Solomon code, the convolution code, the RSC or the coded modulation such as TCM or BCM.

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 via a PATA bus, a SATA bus, a SCSI, an USB, a PCIe or a NAND interface. The memory controller 6220 may have a wireless communication function with a mobile communication protocol such as WiFi or Long-Term Evolution (LTE). The memory controller 6220 may be connected to an external device, for example, the host 6210 or another external device, and then transmit/receive data to/from the external device. Particularly, as the memory controller 6220 is configured to communicate with the external device under one or more of various communication protocols, the memory system and the data processing system in accordance with the present embodiment may be applied to wired/wireless electronic devices or specific a mobile electronic device.

Figure 9:
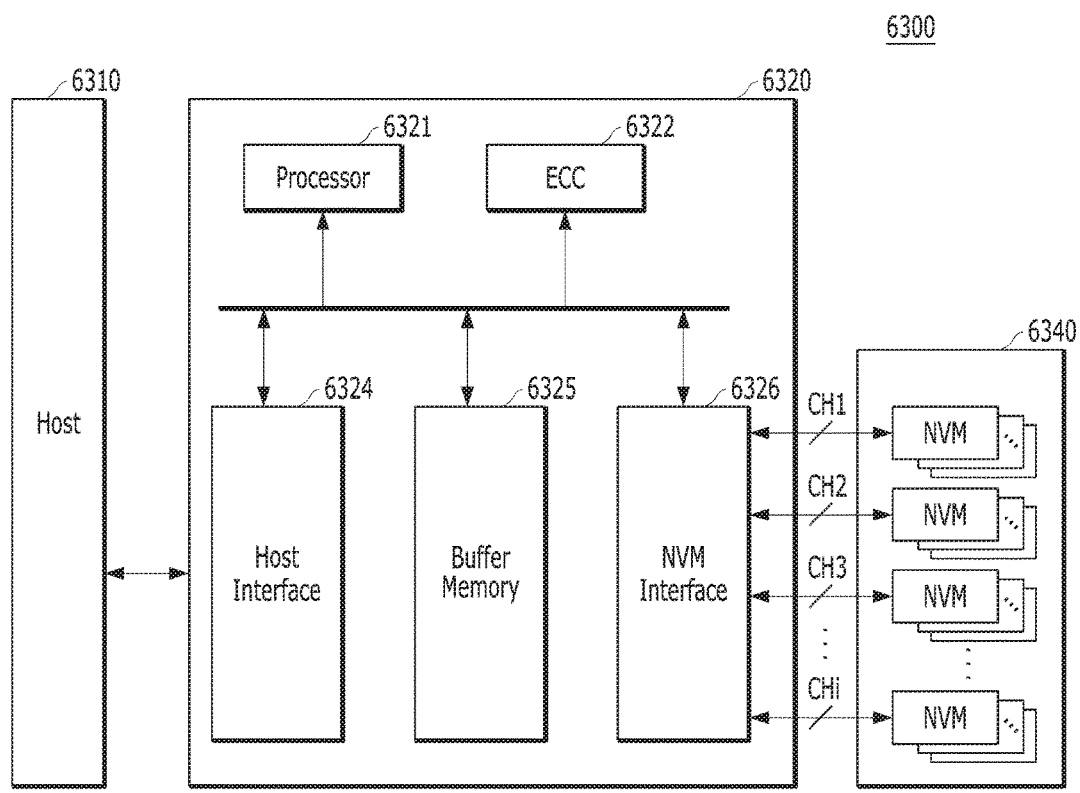

FIG. 9 is a diagram schematically illustrating another example of the data processing system including the memory system in accordance with the present embodiment. FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by volatile memories such as a DRAM, a SDRAM, a DDR SDRAM, a LPDDR SDRAM and a GRAM or nonvolatile memories such as a FRAM, a ReRAM, a STT-MRAM and a PRAM. For convenience of description, FIG. 9 illustrates that the buffer memory 6325 exists in the controller 6320. However, the buffer memory 6325 may be arranged outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, e.g., RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 10:
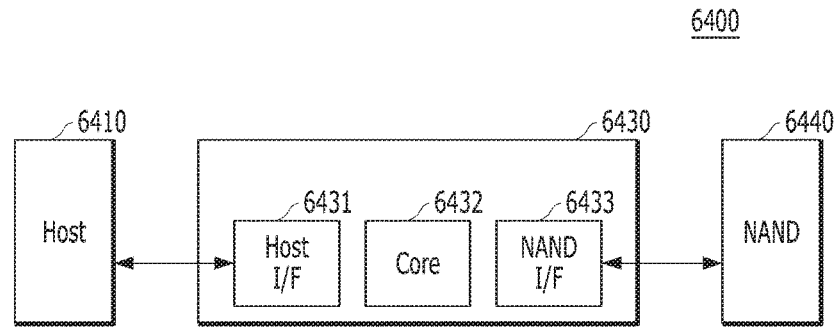

FIG. 10 is a diagram schematically illustrating another example of the data processing system including the memory system in accordance with the present embodiment. FIG. 10 schematically illustrates an embedded Multi-Media Card (eMMC) to which the memory system, in accordance with the embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410. The NAND interface 6433 may provide an interface function between the memory device 6440 and the controller 6430. By the way of example but not limitation, the host interface 6431 may serve as a parallel interface such as MMC interface as described with reference to FIG. 1. Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with the present embodiment. FIGS. 11 to 14 schematically illustrate UFS (Universal Flash Storage) systems to which the memory system in accordance with the present embodiment is app led.

Referring to FIGS. 11 to 14, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 8 to 10, and the UFS cards 6530, 6630, 6730, 6830 may be embodied in the form of the memory card system 6100 described with reference to FIG. 7.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other under various protocols other than the UFS protocol, for example, an UFDs, a MMC, a SD, a mini-SD, and a micro-SD.

Figure 11:
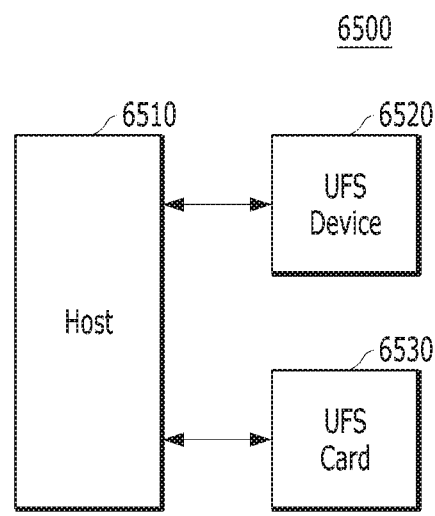

In the UFS system 6500 illustrated in FIG. 11, each of the host 6510, the UFS device 6520 and the UFS card 6530 may include UniPro. The host 6510 may perform a switching operation to communicate with the UFS device 6520 and the UFS card 6530. Particularly, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410. Here, the form of a star is a sort of arrangement where a single device is coupled with plural devices for centralized operation. A plurality of UFS cards may be connected in parallel or in the form of a star to the UFS device 6520 or connected in series or in the form of a chain to the UFS device 6520.

Figure 12:
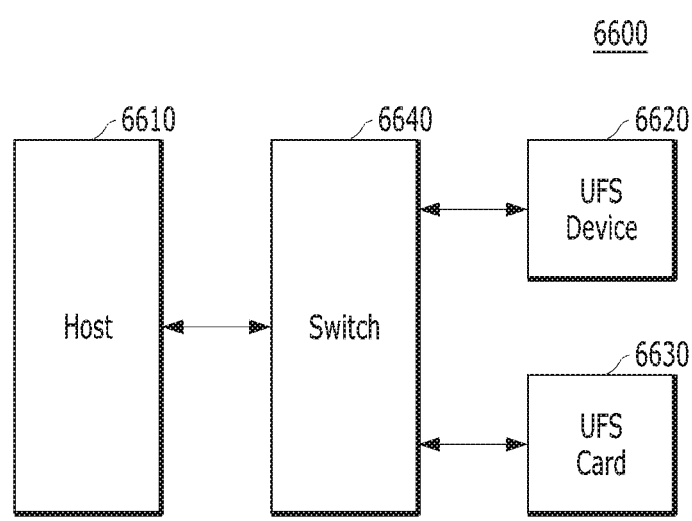

In the UFS system 6600 illustrated in FIG. 12, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640. A plurality of UFS cards may be connected in series or in the form of a chain to the UFS device 6620.

Figure 13:
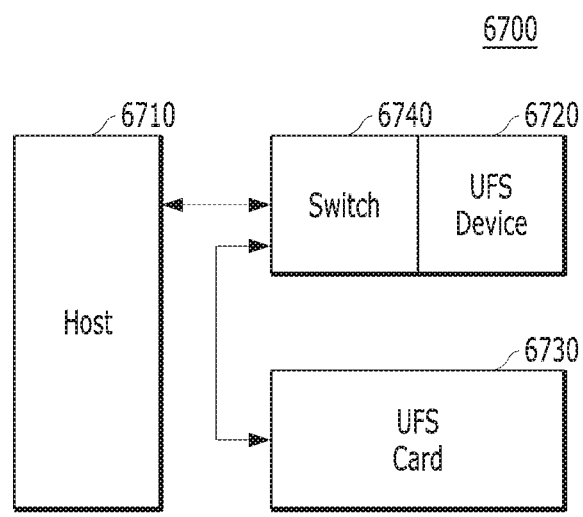

In the UFS system 6700 illustrated in FIG. 13, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the embodiment, the configuration in which one UFS device 6720 and one UFS card 6730 are connected to the switching module 6740 has been exemplified for convenience of description. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 14:
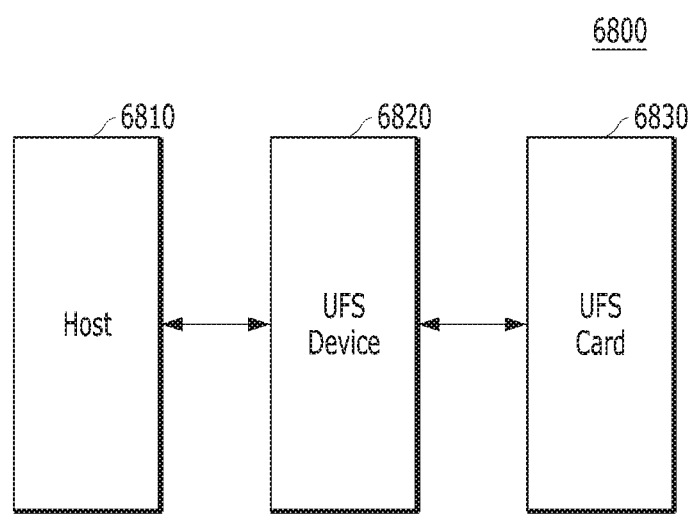

In the UFS system 6800 illustrated in FIG. 14, each of the host 6810, the UFS device 6820 and the UFS card 6830 may include M-PHY and UniPro. The UFS device 6820 may perform a switching operation to communicate with the host 6810 and the UFS card 6830. Particularly, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 15:
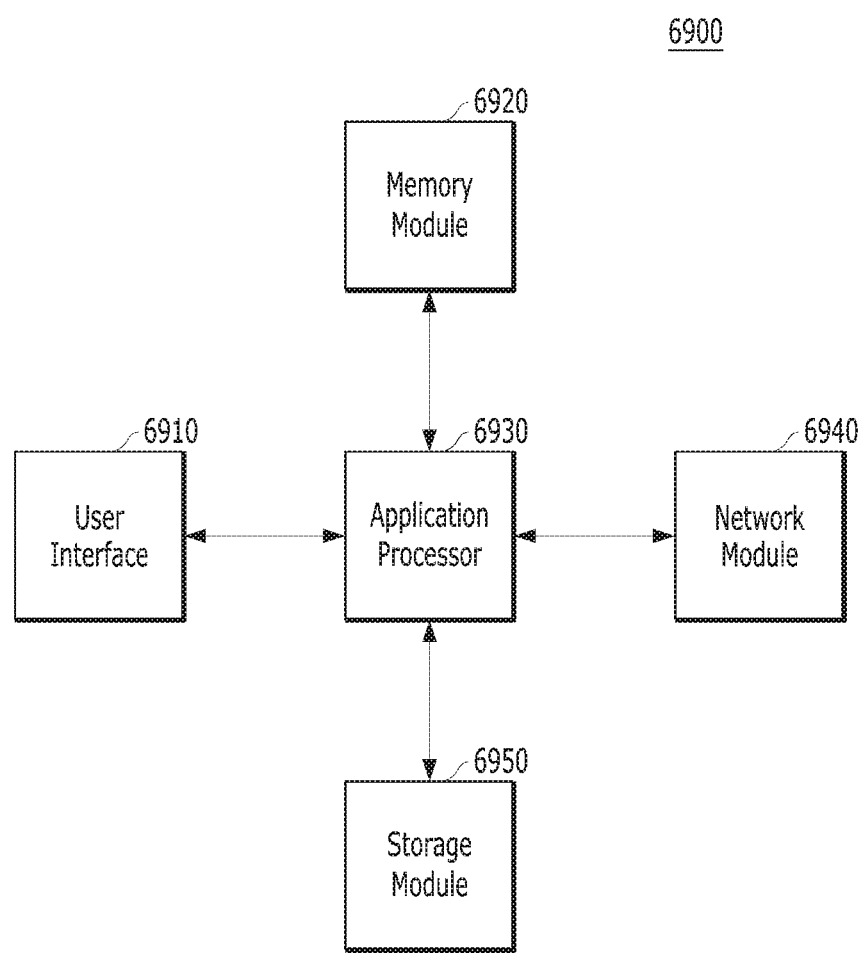

FIG. 15 is a diagram schematically illustrating another example of the data processing system including the memory system in accordance with an embodiment of the present invention. FIG. 15 is a diagram schematically illustrating a user system to which the memory system in accordance with the present embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), Long-Term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device. The user interface 6910 may support a function of receiving data from the touch panel.

In accordance with embodiments of the invention, since the read reclaim operation is performed on a victim block based on read counts of memory blocks instead of a host read amount, the frequency of the read reclaim operation may be adjusted considering an actual extent of damage of the memory blocks.

While the invention has been described with respect to specific embodiments, it will be apparent to those skilled in the art that various changes and modifications may be made without departing from the spirit and scope of the invention as defined in the following claims.

What is claimed is:

1. A memory system, comprising:
   a memory device including a plurality of memory blocks; and
   a controller suitable for measuring read counts of the memory blocks at a timing, calculating a global read count based on the measured read counts, and controlling the memory device to perform a read reclaim operation on a victim block when the global read count is equal to or higher than a threshold value,
   wherein the timing is adjusted based on an increase rate of the global read count.

2. The memory system of claim 1, wherein the controller calculates the global read count by calculating a total sum of the measured read counts of the memory blocks.

3. The memory system of claim 1,
   wherein the controller measures the read counts of the memory blocks at the timing determined based on a fixed host read amount, and
   wherein the controller decreases the fixed host read amount when the increase rate of the global read count is higher than a reference increase rate.

4. The memory system of claim 3, wherein the controller calculates the increase rate of the global read count based on a ratio of a host read amount and the global read count.

5. The memory system of claim 1, wherein the controller detects the victim block based on the measured read counts.

6. The memory system of claim 5, wherein the victim block is a block whose read count is equal to or higher than a read reclaim reference.

7. The memory system of claim 1, wherein the controller stores the read count of each of the memory blocks and the global read count in any one of the memory blocks.

8. The memory system of claim 1, wherein the controller determines at least one attribute of a read command of a host and applies a fixed host read amount based on the at least one attribute.

9. The memory system of claim 8, wherein the controller increases the fixed host read amount when the read command is a sequential read command.

10. The memory system of claim 8, wherein the controller decreases the fixed host read amount when the read command is a random read command.

11. An operating method of a memory system, comprising:
    measuring read counts of a plurality of memory blocks at a timing;
    calculating a global read count based on the measured read counts; and
    performing a read reclaim operation on a victim block when the global read count is equal to or higher than a threshold value,
    wherein the timing is adjusted based on an increase rate of the global read count.

12. The operating method of claim 11, wherein the global read count is calculated by calculating a total sum of the measured read counts of the memory blocks.

13. The operating method of claim 11,
    wherein the measuring of the read counts of a plurality of memory blocks is performed at the timing determined based on a fixed host read amount, and
    wherein the fixed host read amount is decreased when the increase rate of the global read count is higher than a reference increase rate.

14. The operating method of claim 13, wherein the increase rate of the global read count is calculated based on a ratio of a host read amount and the global read count.

15. The operating method of claim 11, further comprising:
    detecting the victim block based on the measured read counts.

16. The operating method of claim 15, wherein the victim block is a block whose read count is equal to or higher than a read reclaim reference.

17. The operating method of claim 11, further comprising:
    storing the read count of each of the memory blocks and the global read count in any one of the memory blocks.

18. The operating method of claim 11, further comprising:
    determining at least one attribute of a read command of a host and applying a fixed host read amount based on the at least one attribute.

19. The operating method of claim 18, wherein the fixed host read amount is increased when the read command is a sequential read command.

20. The operating method of claim 18, wherein the fixed host read amount is decreased when the read command is a random read command.

* * * * *